United States Patent [19]

Vogeli et al.

[11] Patent Number: 5,110,370
[45] Date of Patent: May 5, 1992

[54] PHOTOVOLTAIC DEVICE WITH DECREASED GRIDLINE SHADING AND METHOD FOR ITS MANUFACTURE

[75] Inventors: Craig Vogeli, New Baltimore; Prem Nath, Rochester Hills, both of Mich.

[73] Assignee: United Solar Systems Corporation, Troy, Mich.

[21] Appl. No.: 585,661

[22] Filed: Sep. 20, 1990

[51] Int. Cl.⁵ ............... H01L 31/052; H01L 31/18
[52] U.S. Cl. .................................. 136/256; 136/244; 136/258; 437/2
[58] Field of Search .................... 437/2-5; 136/256, 258 AM, 244

[56] References Cited

U.S. PATENT DOCUMENTS 4,379,202  4/1983  Chalmers .................. 136/256

OTHER PUBLICATIONS

H. Oman, "Solar Cells for Solar Power Satellites", *Proc. European Symp. On Photovoltaic Generators In Space* (1978), pp. 133-138.

Primary Examiner—Arron Weisstuch
Attorney, Agent, or Firm—Krass & Young

[57] ABSTRACT

A photovoltaic cell includes a light-directing optical element integrally formed in an encapsulant layer thereof in the region of opaque current-collecting gridlines. The optical element redirects light which would be absorbed by the opaque structure to other regions of the photovoltaic device, thereby decreasing shading effects.

18 Claims, 3 Drawing Sheets

PHOTOVOLTAIC DEVICE WITH DECREASED GRIDLINE SHADING AND METHOD FOR ITS MANUFACTURE

FIELD OF THE INVENTION

This invention relates generally to photovoltaic devices. More specifically, the invention relates to photovoltaic devices with increased efficiency resultant from the minimization of shading effects caused by current-collecting grids.

BACKGROUND OF THE INVENTION

Photovoltaic energy is becoming a very significant power source for several reasons. Fossil fuels are becoming scarcer, and hence more expensive, every day. Furthermore, the burning of fossil fuels releases pollutants, including greenhouse gases which contribute to problems of global warming. Also, recent events have raised questions as to the safety and cost-effectiveness of nuclear power. For these reasons, traditional energy sources have become far less attractive. Photovoltaic energy, on the other hand, is inherently non-polluting, safe and silent. In addition, recent advances in photovoltaic technology have significantly increased the efficiency, and decreased the cost, of such devices.

For example, it is now possible to manufacture large area silicon and/or germanium alloy materials which manifest electrical, optical, chemical, and physical properties equivalent, and in many instances superior to, their single crystalline counterparts. Layers of such alloys can be economically deposited at high speed over relatively large areas and in a variety of stacked configurations. Such alloys readily lend themselves to the manufacture of low cost photovoltaic devices. Examples of particular fluorinated semiconductor alloy materials having significant utility in fabrication of photovoltaic devices are described in U.S. Pat. No. 4,226,898 and U.S. Pat. No. 4,217,374, both invented by Ovshinsky et al, the disclosures of which are incorporated herein by reference.

In a typical large area photovoltaic device, a number of current-collecting structures are employed to convey photo-generated current to a terminal or other collection point. As used herein, these various structures will be referred to as "current-collecting grids" or "gridlines," these terms being understood to include both grids and bus bars as well as any other opaque conductors associated with the light incident side of photovoltaic devices. Use of current-collecting grids is necessary to withdraw power from the photovoltaic device; however, these grids are typically made of high electrical conductivity material such as deposited metal patterns, adhesively adhered metal tapes, metal-containing pastes, metallic inks or plated layers and are quite opaque. The gridlines shade underlying portions of the photovoltaic device thereby preventing it from generating power. Clearly, the gridlines are needed to allow for the efficient withdrawal of photo-generated current, but their presence also detracts from the overall efficiency of the cell. The lines can be made smaller; however, this increases their electrical resistance and thereby tends to decrease cell efficiency. Under the constraints of the prior art, a designer of photovoltaic devices is caught in a dilemma of having to balance the electrical resistance of the cell versus the amount of active area presented for illumination.

In some instances, prior art cells relied upon the use of relatively thin deposits of high conductivity metals such as pure gold, silver or copper to provide high conductivity, relatively small area gridlines. However, such approaches require the use of sophisticated photolithographic techniques for patterning the gridlines. Additionally, the length of such thin gridlines was limited by the need to avoid high resistivity; consequently, this approach is limited in size and is quite expensive. Lower cost, easier to apply gridlines prepared from paste or ink material are quite desirable; however, they are of lower conductivity and hence must be made fairly thick and wide to achieve sufficient current carrying capabilities. Such materials were not heretofore practical since the gridlines they provide create a high level of shading. What is needed is a method and structure which permits the use of relatively wide gridline patterns, while minimizing shading from those gridlines.

Various attempts have been implemented in the prior art to employ optical systems to concentrate light in areas remote from gridlines. Such approaches involve the use of prismatic arrays and the like. These arrays are typically supported in a spaced-apart relationship with the photovoltaic device or they are adhesively affixed to the light incident side of the device and, when properly aligned, redirect light falling in the region of gridlines to grid-free portions of the device. This technology is typically employed in conjunction with concentrator cells. An overview of this technology is presented by Zhao et al in a paper entitled "Improvements in Silicon Concentrator Cells," published in the Proceedings of the 4th International Photovoltaic Science and Engineering Conference, Sydney, Australia, Feb. 14-17, 1989, Vol. 2, p 581. Use of a Fresnel, lenticular concentrator is also disclosed in U.S. Pat. No. 4,711,972. These prior art approaches employ fairly precise, molded lenses which must either be adhesively affixed to a photovoltaic cell or mounted in a support frame spaced apart from the photovoltaic cell in proper alignment. Use of lenses of this type requires skill in placement and affixation. If the lenses are misaligned, they will be worse than useless since they will direct light to, rather than away from, the gridlines. In use, conditions such as ambient heat and/or mechanical impact can misalign the lens element, thereby decreasing cell efficiency.

What is needed is a photovoltaic device having decreased shading from gridlines, which device does not necessitate the precise placement and adhesive affixation of a separate lens element. The present invention provides for an improved photovoltaic cell having decreased shading as well as for a simple method of manufacturing that cell. According to the present invention, light-directing optics are formed integral with the photovoltaic device as a step in its manufacture. This results in a low cost, high efficiency, high accuracy process for the manufacture of photovoltaic devices having increased efficiencies. The method of the present invention may be adapted for the manufacture of single cells as well as for the manufacture of modules comprised of interconnected cells. These and other advantages of the present invention will be readily apparent from the drawings, discussion and description which follow.

SUMMARY OF THE INVENTION

There is disclosed herein a method of manufacturing a photovoltaic device having decreased shading from collector gridlines. The method includes the steps of providing a photovoltaic cell which includes a bottom electrode layer, a photovoltaic body disposed atop the bottom electrode layer and a top electrode layer disposed atop the photovoltaic body. The photovoltaic cell further includes an electrically-conductive, current-collecting gridline associated in electrical communication with the top electrode. The method includes the further step of disposing a layer of embossible, transparent-encapsulating material atop the top electrode layer, providing an embossing die which includes at least one groove-forming element thereon and aligning the die with the photovoltaic cell so that the groove-forming element is in registry with at least a portion of the length of the gridline and in contact with the layer of encapsulating material. The method further includes the step of compressing the embossing die and photovoltaic cell so as to emboss a groove into the encapsulant layer and the final step of removing the embossing die. In this manner, there is provided a photovoltaic cell having a groove integral with the encapsulating layer. The groove is operable to direct incident illumination away from the gridline so as to decrease shading effects caused by it. In particular embodiments, the transparent embossible layer is a layer of synthetic organic polymer material such as ethylene vinyl acetate, polytetrafluoroethylene, polyvinyl fluoride, polyvinyl acetate, polystyrene, polyurethane and combinations thereof. In particular embodiments, a two step process is carried out wherein the cell and encapsulant are first laminated to provide a self-supporting structure which is subsequently embossed (and optionally cross-linked) in a second step. In some embodiments, the embossing die is heated and compression is carried out at pressures of approximately one atmosphere. In a particular embodiment, the layer of transparent polymeric material is a layer of thermally cross-linkable material and it becomes hardened while the groove is embossed.

The method of the present invention may be adapted to the manufacture of large area modules comprised of a plurality of interconnected cells and includes the initial step of disposing a plurality of photovoltaic cells onto a support member and encapsulating those cells with a layer of transparent encapsulant material. The method includes a further step of providing a plurality of embossing dies, each including at least one groove-forming element, as well as the steps of aligning the dies with corresponding photovoltaic cells and compressing the dies and cells. Alignment may be accomplished by punching alignment holes into the support portion of the module and providing the dies with pins configured to fit in the holes. In this manner, the dies may be aligned properly with regard to individual strip cells thereby eliminating problems resulting from slight misalignment between individual cells.

The present invention further includes an improved photovoltaic cell manufactured according to the method and including an optical element formed integral with the encapsulant layer.

DETAILED DESCRIPTION OF THE INVENTION

Figure 1:
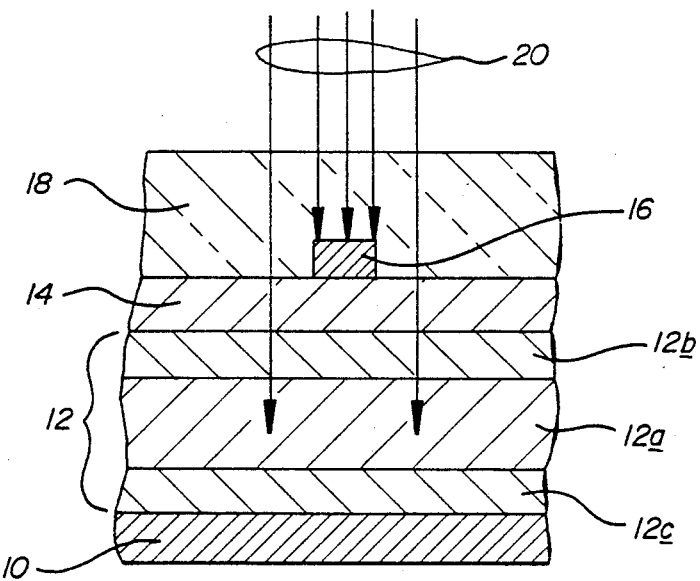
FIG. 1 is a cross-sectional view of a portion of a photovoltaic cell of the prior art illustrating the problem of gridline shading.

Referring now to FIG. 1, there is shown a cross-sectional view of a portion of a photovoltaic cell of the prior art illustrating the problem of gridline shading. The cell includes a substrate 10, which in this instance is a metallic substrate which also functions as a bottom electrode layer. Disposed immediately atop the electrically-conductive substrate 10 is a body of photovoltaic material 12 and immediately thereatop on the light incident side of the photovoltaic body 12, is a top electrode layer 14. The top electrode layer 14 is most preferably fabricated from a transparent material so as to permit passage of light therethrough. Associated with the top electrode layer 14 is a gridline 16 which operates to collect current from the top electrode layer 14 and carry it to a bus bar or other terminal. The top, i.e. light incident, surface of the photovoltaic device is protected by a layer of transparent, encapsulant material 18.

There are a great variety of materials which may be utilized to manufacture the photovoltaic devices of the present invention. The bottom electrode layer is fabricated from an electrically-conductive material and as noted hereinabove, may also function as a support substrate for the device. Toward that end, one preferred material is stainless steel of approximately 8 mils thickness. Other substrates include electrically-insulating materials such as polymeric bodies, glass or ceramics and, in such instances, the electrode layer will be deposited thereatop. The photovoltaic body 12, as is well known to those of skill in the art, operates to absorb incident photons and to generate electron-hole pairs in response thereto, and to separate the members of these pairs and direct them to the respective electrodes 10,14 of the cell. There are a great variety of photovoltaic materials known to those of skill in the art and the present invention is not limited to any one such material. Among some of the preferred materials are the thin film materials such as the fluorinated silicon and germanium alloys referred to hereinabove as well as cadmium telluride, gallium arsenide, copper indium diselenide, single crystal silicon and the like. In one particularly preferred embodiment, the photovoltaic body comprises at least one triad of silicon alloy material which includes a layer of intrinsic material 12a interposed between N-type 12b and P-type 12c alloy materials. In one preferred embodiment, at least one of the N-type 12b and P-type layers 12c is a microcrystalline layer, preferably the layer proximate the light incident side of the photovoltaic device. In some instances, a number of triads of N-I-P (or P-I-N) type materials are stacked one atop another to provide for enhanced efficiency and sensitivity.

The top electrode layer 14, as noted hereinabove, is preferably a transparent body and there are available a number of highly degenerate semiconductors such as indiumtin oxide and the like which may be employed as top electrode layers. The gridline 16 is preferably fabricated from an electrically-conductive ink or paste or it may be a metallic body adhered to the top electrode layer. In some instances, the gridline 16 is placed beneath or embedded within the top electrode layer 14. For this reason, and within the context of the present invention, the gridline 16 is described as being electrically associated with the top electrode layer 14. The layer of encapsulant material 18 protects the components of the photovoltaic cell from the ambient environment and from mechanical damage. The encapsulant layer 18 is preferably fabricated from a material which is highly transparent and inert. Organic polymers comprise the most preferred materials for this layer and ethylene vinyl acetate (EVA) is one particularly preferred material. Cross-linkable ethylene vinyl acetate having particular utility in the present invention is sold by the Du Pont de Nemours, E.I. & Company. Other preferred materials include fluorocarbon polymers, polyurethane, polystyrene, and polyvinyl acetate as well as various silicon compounds. In some instances, a bi-layered structure of fluoropolymer/EVA is employed.

FIG. 1 illustrates the manner in which prior art photovoltaic cells suffered from problems of gridline shading. As will be noted, a photon flux 20 is shown as incident upon the device. Those photons which strike the gridline 16 are absorbed, or in some instances reflected, and hence not available to penetrate the photovoltaic body and generate charge carriers. These photons effectively represent a loss in the efficiency of the cell.

Figure 2:
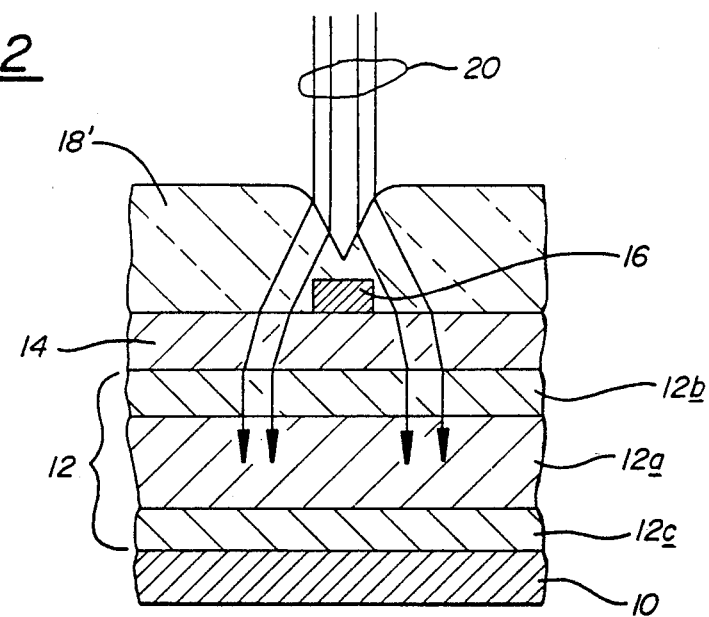
FIG. 2 is a cross section of a portion of a photovoltaic cell configured in accordance with the principles of the present invention and illustrating the manner in which the present invention operates to minimize gridline shading.

Referring now to FIG. 2, there is shown a photovoltaic device generally similar to that of FIG. 1, but including the improvement of the present invention which comprises a transparent encapsulating layer 18' configured to include an integral optical element in a form of a groove disposed in the region of the gridline 16. The particularly configured transparent encapsulant layer 18' operates to diffract incident light 20 away from the gridline 16 and into the photovoltaic body 12. In this manner, shading losses occasioned by the presence of the gridlines 16 are minimized. As a consequence, gridlines may be made wider and hence longer and the cell size may be greatly increased.

Since the light-directing optical element of the present invention is provided integral with the transparent encapsulating layer 18', problems attendant upon the alignment and adherence of a separate optical element are eliminated. In accordance with the principles of the present invention, the grooved optical element is formed in the layer only after the encapsulation of the photovoltaic cell, and problems occasioned by the misalignment and/or detachment of a separate optical element are eliminated.

Figure 3:
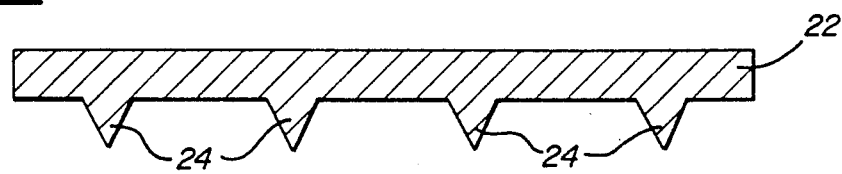
FIG. 3 is a cross-sectional view of one embossing die which may be utilized in the practice of the present invention.

In the most preferred embodiment of the present invention, the grooved optical element is formed in the transparent encapsulating layer by an embossing process employing a die generally similar to that depicted to that in cross section in FIG. 3. The die 22 of FIG. 3 is preferably fabricated from a metal, ceramic or similar durable material having good heat transfer characteristics and includes a number of groove-forming projections 24 upon the face thereof. The spacing between adjoining groove-forming portions is selected to correspond to the spacing between grid fingers in a given configuration of photovoltaic device.

In accordance with the method of the present invention, a photovoltaic cell is first provided with a top encapsulant layer, such as the polymeric layer 18 described with reference to FIG. 1. This layer is affixed by a laminating process carried out a moderate temperature so as to avoid cross-linking the encapsulant. The structure thus produced is sufficiently rigid to withstand subsequent handling and processing. In the second step, an embossing die generally similar to that of FIG. 3 is aligned with the photovoltaic cell so that the groove-forming portions 24 thereof are aligned substantially with the grid fingers. At that time, the die 22 and cell are compressed so as to emboss the groove pattern into the transparent layer to produce a structure similar to layer 18' of FIG. 2. The process may be facilitated by heating of the embossing die 22. In general, any combination of parameters which will produce a relatively permanent deformation of the encapsulating layer may be employed. However, it has been found most preferable in accord with the present invention to utilize an encapsulant material which is cross-linkable, i.e. a material which cross links and hardens at elevated temperatures to provide a permanent structure. The aforementioned EVA polymer fulfills these criteria since it initially softens at a temperature of approximately 60° C. and subsequently cross links to form a hard layer at a temperature of approximately 140° C. These properties allow the groove-forming elements to initially penetrate and shape the layer, and subsequently harden it to cause it to retain its shape and the optical characteristics produced thereby. In a typical process employing an EVA layer, the die is heated to approximately 150° C. and a pressure of one atmosphere is maintained on the die for approximately 30 minutes. In some instances, the initial lamination and the embossing may be carried out in a one-step concerted process.

Figure 4:
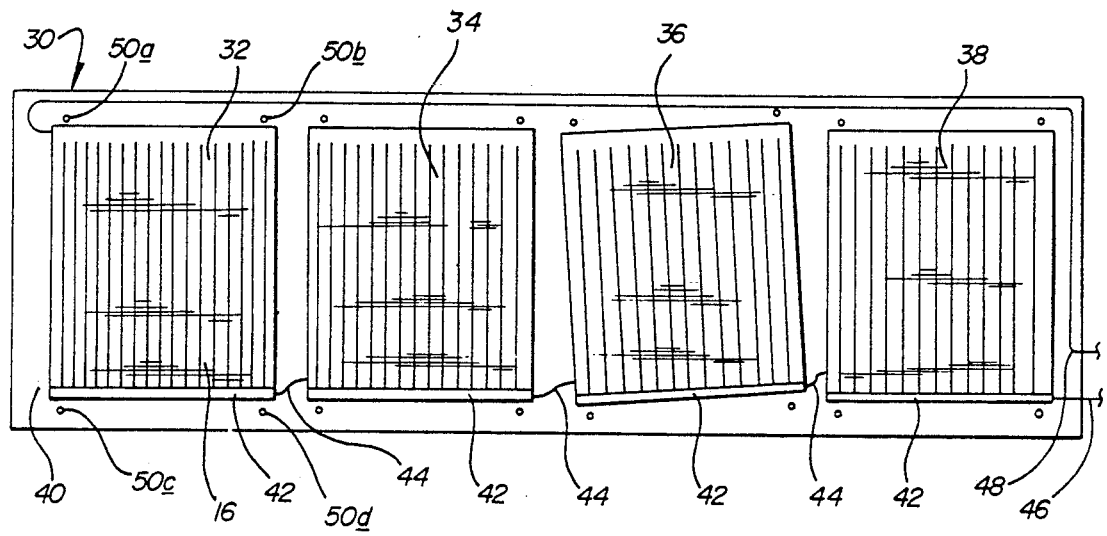
FIG. 4 is a top plan view of a large area photovoltaic module structured in accordance with the principles of the present invention.

It is frequently desirable to interconnect smaller area photovoltaic cells into a large area module so as to provide an increased voltage and/or power-producing capability. The present invention may be readily adapted for use in connection with the production of large area modules. Referring now to FIG. 4, there is shown a large area photovoltaic module 30 comprised of four individual photovoltaic cells 32,34,36,38 disposed upon a support substrate 40. The individual cells 32,34,36,38 each include a plurality of gridlines 16 formed thereupon. Each gridline is in electrical communication with a bus bar 42 disposed on the periphery of the cell. The individual cells 32,34,36,38 of the module 30 of FIG. 4 are interconnected in a series relationship by means of electrically-conductive jumpers 44 interconnecting the bus bars 42 of a first cell with the bottom electrode of an adjacent cell. The module further includes a pair of output terminals 46,48 electrically connected to the bus bar 42 cell 38 and to the bottom electrode of cell 32. At this stage, the individual cells are laminated into a single large-area device as noted above, by moderate heat and compression (typically 60° C. when EVA is the laminant). It will be noted from the figure that the individual cells 32,34,36,38 are not all evenly aligned on the substrate 40. The present invention provides for a method of embossing the groove pattern into the cells without regard to any alignment requirements between the various cells and thereby simplifies module manufacture. It will be noted from the figure that each of the cells 32,34,36,38 has four alignment holes 50a,50b,50c,50d associated therewith. After the initial lamination, these holes are punched through the substrate 40 and are oriented with regard to the orientation of the individual cell and serve as alignment guides for placement of the embossing die. Punching of the alignment holes 50, may be accomplished by the use of a template having indicia which are aligned with the grid pattern or other feature of the cell and which serve to properly position the punches.

Figure 5:
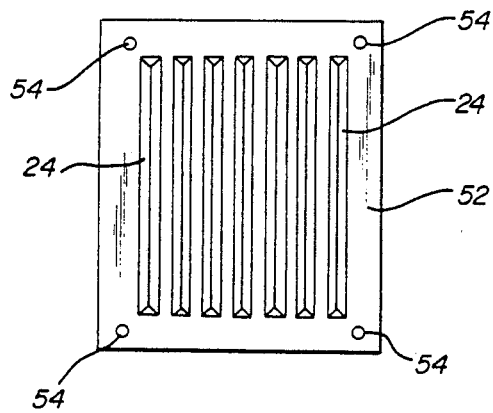
FIG. 5 is a top plan view of an embossing die of the type utilized to manufacture the module of FIG. 4.

Referring now to FIG. 5 there is shown a top plan view of an embossing die 52 generally similar to that illustrated in FIG. 3 but further including four alignment pins 54 thereupon. These pins, when placed into the corresponding pin holes in the module, serve to align the groove-forming elements 24 of the die 52 with the gridlines 16. When the module is to be completed, individual dies are placed in registry with each cell through the use of the alignment pins 54 and the entire assembly is compressed, preferably with heating, to effect groove formation.

Figure 6:
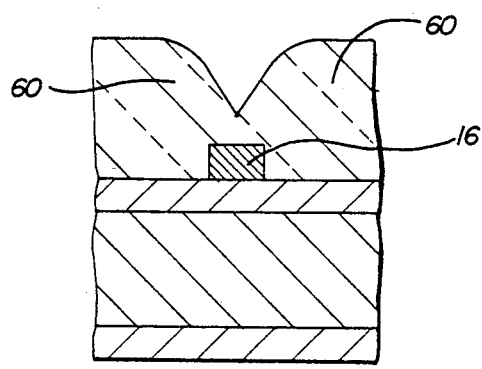
FIG. 6 is a cross-sectional view of a portion of a photovoltaic cell illustrating another configuration of a groove employed in accordance with the present invention.

While the foregoing figures depicted the grooves as being straight-sided grooves having flattened areas therebetween, the present invention may be practiced with other groove structures. For example, FIG. 6 depicts a curved groove structure having rounded, lenticular portions 60 between adjoining grid fingers 16. Many other variations will be readily apparent to one of skill in the art. For example, by selecting the width and angle of the grooves, the acceptance of illumination may be varied to account for seasonal variations in the direction of insolation. Wider grooves will tend to gather more light; however, a groove which is too wide can cause redirection of light onto adjoining grid fingers. One of skill in the art could readily control the parameters of finger spacing and groove shapes so as to achieve a minimization of shading and a maximization of power output.

Figure 7A:
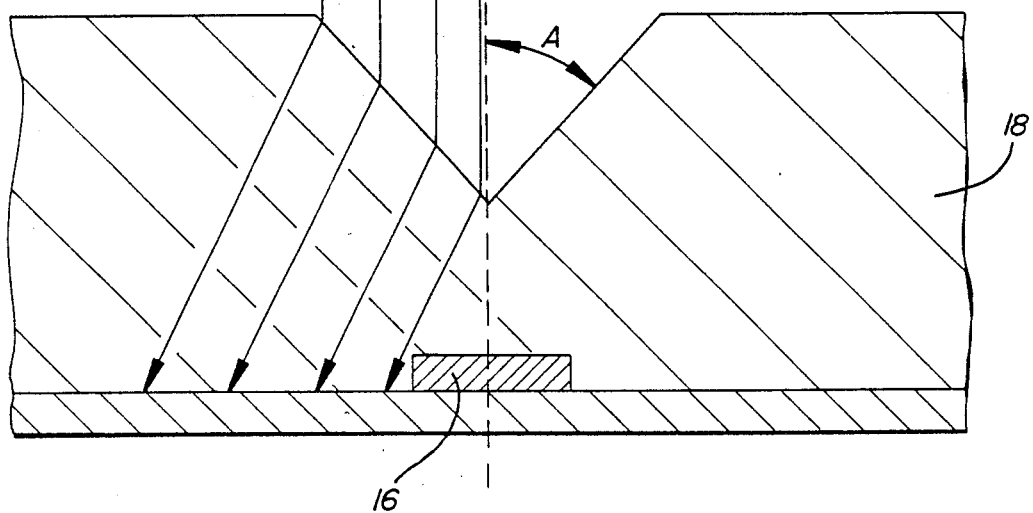
FIG. 7A is a cross-sectional view of a photovoltaic cell illustrating one particular configuration of groove structured in accordance with the present invention.
Figure 7B:
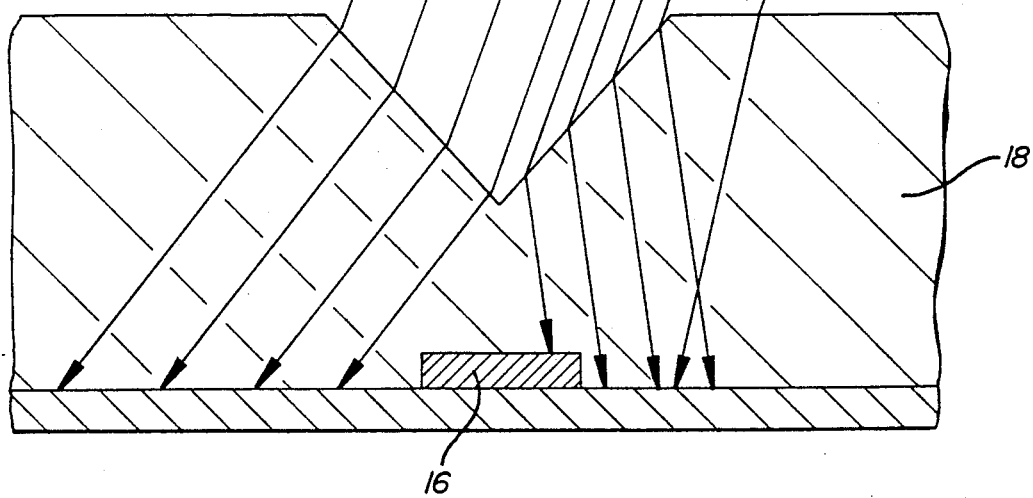
FIG. 7B is a cross-sectional view of the cell of FIG. 7A, illuminated at an oblique angle.

FIGS. 7A and 7B illustrate one particular configuration of groove width and angle as optimized to accommodate the varying angles of insolation. FIG. 7A depicts one particular configuration of photovoltaic device structured in accordance with the principles of the present invention. The device of FIG. 7A includes a top encapsulating layer 18, generally similar to those previously described and being approximately 0.95 millimeters in thickness. The device further includes a gridline 16 which is 0.3 millimeters in width. The groove formed in the encapsulant layer forms an angle "A" of approximately 42° with the perpendicular bisector of the groove indicated by the dashed line. The width of the groove as measured across the top of the layer 18 is approximately 0.8 millimeters.

As illustrated in FIG. 7A, a flux of light 20 is incident upon the device in a direction perpendicular to the top surface of the device. As will be noted, the light is directed away from the gridline 16. FIG. 7B is a depiction of the same photovoltaic device having light flux 20 incident at an angle of approximately 70° (20° off the perpendicular) to the surface thereof. It will be noted that the particular configuration of groove still functions to greatly minimize shading. Only a small portion of the light is actually incident upon the gridline 16.

The particular angle and width of a groove will depend upon the thickness of the underlying layer and the width of the gridline. Calculation of groove configuration may be readily undertaken by one of skill in the art employing basic principles of optics. Clearly, configurations other than those shown herein will be readily apparent to one of skill in the art in view of the drawings, discussion and description which are included herein. The foregoing are illustrative of particular embodiments of the present invention and are not limitations upon the practice thereof. It is the following claims, including all equivalents, which define the scope of the invention.

We claim:

1. A method of manufacturing a photovoltaic device having decreased shading of incident illumination from collector grid lines, said method comprising the steps of:
   providing a photovoltaic cell, said cell including a bottom electrode layer, a photovoltaic body disposed atop the bottom electrode layer, a top electrode layer disposed atop the photovoltaic body and an electrically-conductive, current-collecting grid line in electrical communication with said top electrode layer;
   disposing a layer of embossable, transparent, organic, polymeric, encapsulating material directly atop the top electrode layer;
   providing an embossing die, said die including at least one groove forming element;
   aligning the embossing die with the photovoltaic cell so that the groove forming element thereof is in registry with at least a portion of the length of the grid line and in contact with the layer of polymeric encapsulating material; and
   compressing the embossing die and photovoltaic cell so as to emboss a groove into the layer of encapsulating material; and
   removing the embossing die, whereby there is provided a photovoltaic cell having a groove integral with the encapsulant layer, said groove operable to direct incident illumination away from the grid line so as to decrease the shading effects thereof.

2. A method as in claim 1, wherein the step of disposing a layer of encapsulating material atop the top electrode layer includes the further step of laminating said layer to the top electrode layer and wherein the steps of aligning and compressing are carried out after said laminating step.

3. A method as in claim 1, wherein the step of disposing said layer of organic polymeric material includes a further step of selecting said material from the group consisting of ethylene vinyl acetate, polytetrafluoroethylene, polyvinyl fluoride, polyvinyl acetate, polystyrene, polyurethane, and combinations thereof.

4. A method as in claim 1, wherein said polymeric material is a thermally cross-linkable material.

5. A method as in claim 1, including the further step of heating said embossing die.

6. A method as in claim 5, wherein the step of heating said die comprises heating to a temperature of approximately 150° C.

7. A method as in claim 1, wherein the step of compressing said photovoltaic cell and die comprises compressing said cell and die at a pressure of approximately one atmosphere psi.

8. A method as in claim 1, wherein the step of compressing said photovoltaic cell and die further comprises maintaining said cell and die under compression for approximately 30 minutes.

9. A method as in claim 1, wherein the step of providing a photovoltaic cell comprises providing a photovoltaic cell having a photovoltaic body including at least one layer of a fluorinated, silicon alloy material.

10. A method of manufacturing a large area photovoltaic module, said method comprising the steps of:
   providing a plurality of photovoltaic cells, each cell including a bottom electrode member, a photovoltaic body disposed in electrical communication with the bottom electrode, a top electrode disposed atop the photovoltaic body, and at least one electrically-conductive grid line associated in electrical communication with the top electrode;
   disposing said plurality of cells on a support member in an electrically interconnected relationship;
   disposing a layer of transparent, organic, polymeric, encapsulant material directly atop the top electrode and said at least one gridline of each of the photovoltaic cells;
   laminating said encapsulant material onto said cells so as to provide a self-supporting assembly;
   providing a plurality of embossing dies, each die including at least one groove-forming element;
   aligning each of said plurality of dies with a corresponding one of said photovoltaic cells so that the groove-forming element thereof is in registry with at least a portion of the length of one of said at least one gridline; and
   compressing said dies and laminated assembly of photovoltaic cells whereby said dies form grooves in the transparent encapsulating layer in the region of the gridlines so as to provide a light-directing optical element integral with said layer of encapsulant material and operable to decrease gridline shading.

11. A method as in claim 10, wherein the step of aligning each of said dies with a corresponding one of said cells comprises:
   providing alignment pins on each of said plurality of dies;
   providing corresponding alignment pin holes in said support member; and
   placing said alignment pins in the said alignment pin holes.

12. A method as in claim 10, wherein the step of disposing said cells on said support member in an electrically interconnected relationship comprises the step of interconnecting said cells in a series electrical relationship.

13. A method as in claim 10, wherein the step of disposing said cells on said support member in an electrically interconnected relationship includes the further step of interconnecting said cells in a series electrical relationship.

14. A method as in claim 10, wherein the step of providing a layer of transparent, encapsulant material comprises selecting said material from the group consisting of: ethylene vinyl acetate, poly tetrafluoroethylene, polyvinyl fluoride, polyurethane and combinations thereof.

15. A method as in claim 10, including the further step of heating said plurality of dies.

16. A photovoltaic cell having decreased shading, said cell comprising:
   a layer of bottom electrode material;
   a photovoltaic body disposed upon said layer of bottom electrode material;
   a layer of top electrode material disposed upon said photovoltaic body in a spaced apart relationship with said layer of bottom electrode material so that the photovoltaic body is sandwiched therebetween;
   at least one electrically-conductive, current-collecting grid line associated in electrical communication with said top electrode; and
   a layer of transparent, electrically insulating synthetic organic polymeric material disposed directly upon said top electrode material and said at least one grid line so as to cover the top electrode and the at least one gridline, said encapsulating layer having a groove formed integrally therein generally coextensive with the length of said current-collecting gridline, said groove operative to diffract incident light away from the underlying grid line so that said light illuminates adjacent portions of said photovoltaic cell, whereby shading effects caused by said grid line are minimized.

17. A photovoltaic cell as in claim 16, wherein said photovoltaic body is comprised of at least one triad of superposed layers of N-type, I-type and P-type silicon alloy material.

18. A photovoltaic device as in claim 17, wherein said layer of I-type silicon alloy material is a layer of amorphous alloy material and at least one of said P-type and N-type layers of silicon alloy material is a layer of microcrystalline alloy material.

* * * * *